US008922981B2

(12) United States Patent
Leigh et al.

(10) Patent No.: US 8,922,981 B2
(45) Date of Patent: Dec. 30, 2014

(54) RACK MOUNTED UI DEVICE

(75) Inventors: Kevin B. Leigh, Houston, TX (US);
Belgie B. McClelland, Tomball, TX (US); Keith J. Kuehn, Magnolia, TX (US)

(73) Assignee: Hewlett-Packard Development Company, L.P., Houston, TX (US)

(*) Notice: Subject to any disclaimer, the term of this patent is extended or adjusted under 35 U.S.C. 154(b) by 184 days.

(21) Appl. No.: 13/810,582

(22) PCT Filed: Oct. 4, 2010

(86) PCT No.: PCT/US2010/051354
§ 371 (c)(1),
(2), (4) Date: Jan. 16, 2013

(87) PCT Pub. No.: WO2012/047197
PCT Pub. Date: Apr. 12, 2012

(65) Prior Publication Data
US 2013/0114197 A1 May 9, 2013

(51) Int. Cl.
*G06F 1/16* (2006.01)
*H05K 7/14* (2006.01)
*G06F 3/14* (2006.01)

(52) U.S. Cl.
CPC ............ *G06F 1/1601* (2013.01); *H05K 7/1494* (2013.01); *G06F 3/1423* (2013.01); *G09G 2370/02* (2013.01); *G09G 2370/16* (2013.01)
USPC .................................................. 361/679.01

(58) Field of Classification Search
USPC ........................................ 361/679.01, 679.04
See application file for complete search history.

(56) References Cited

U.S. PATENT DOCUMENTS

| 5,388,032 | A | * | 2/1995 | Gill et al. ........................ 700/17 |
| 5,537,127 | A | * | 7/1996 | Jingu ............................. 345/1.3 |
| 6,185,092 | B1 | * | 2/2001 | Landrum et al. ......... 361/679.11 |
| 6,201,690 | B1 | * | 3/2001 | Moore et al. ............. 361/679.21 |
| 6,802,575 | B1 | | 10/2004 | Lee |
| 6,961,246 | B2 | * | 11/2005 | Dickey et al. ................. 361/724 |
| 7,248,246 | B2 | | 7/2007 | Rhoads |
| 7,256,986 | B2 | | 8/2007 | Williams et al. |
| 7,527,155 | B2 | * | 5/2009 | McClain et al. ................ 211/26 |
| 7,591,383 | B1 | | 9/2009 | Milton |
| 7,619,897 | B2 | * | 11/2009 | Della Fiora et al. .......... 361/724 |
| 7,643,303 | B1 | * | 1/2010 | Heistand et al. .............. 361/724 |
| 8,102,333 | B2 | * | 1/2012 | Kondo et al. .................. 345/1.3 |
| 8,313,072 | B2 | * | 11/2012 | Bakkom et al. .......... 248/289.11 |
| 2003/0156096 | A1 | | 8/2003 | Lu et al. |
| 2005/0168926 | A1 | | 8/2005 | Lee et al. |
| 2006/0125358 | A1 | * | 6/2006 | Williamson ............... 312/223.1 |
| 2007/0175837 | A1 | * | 8/2007 | Furman .......................... 211/26 |
| 2008/0123284 | A1 | * | 5/2008 | Jaramillo et al. ............. 361/686 |
| 2011/0172815 | A1 | * | 7/2011 | Kim .............................. 700/235 |

FOREIGN PATENT DOCUMENTS

JP 2005100316 4/2005

OTHER PUBLICATIONS

International Searching Authority, The International Search Report and the Written Opinion, Jul. 22, 2011, 8 Pages.

* cited by examiner

*Primary Examiner* — Lisa Lea Edmonds
(74) *Attorney, Agent, or Firm* — Hewlett-Packard Patent Department; Steven L. Webb

(57) ABSTRACT

A user interface (UI) device is disclosed. The UI device has two displays (106 and 108) that can be moved between a first position and a second position. In the first position the two displays (106 and 108) are side-by-side and the display surface for each of the two displays forms a common plane. In the second position the display surfaces face away from each other.

11 Claims, 3 Drawing Sheets

RACK MOUNTED UI DEVICE

BACKGROUND

Data centers typically contain racks of equipment arranged in rows. Each rack typically has a standard width and length. Each rack may contain a number of Made servers, memory devices, storage devices, switches, I/O devices, power supplies, management controller and the like. The equipment inside each rack may need to be configured or managed. Typically a user interface (UI) device, for example a display and keyboard, is coupled to the rack and used to configure or monitor the equipment inside each rack.

DETAILED DESCRIPTION

FIGS. 1-2 and the following description depict specific examples to teach those skilled in the art how to make and the best mode of the invention. For the purpose of teaching inventive principles, some conventional aspects have been simplified or omitted. Those skilled. in the art will appreciate variations from these examples that all within the scope of the invention. Those skilled in the art will appreciate that the features described below can be combined in various ways to form multiple variations of the invention. As a. result, the invention is not limited to the specific examples described below, but only by the claims and their equivalents.

Figure 1A:
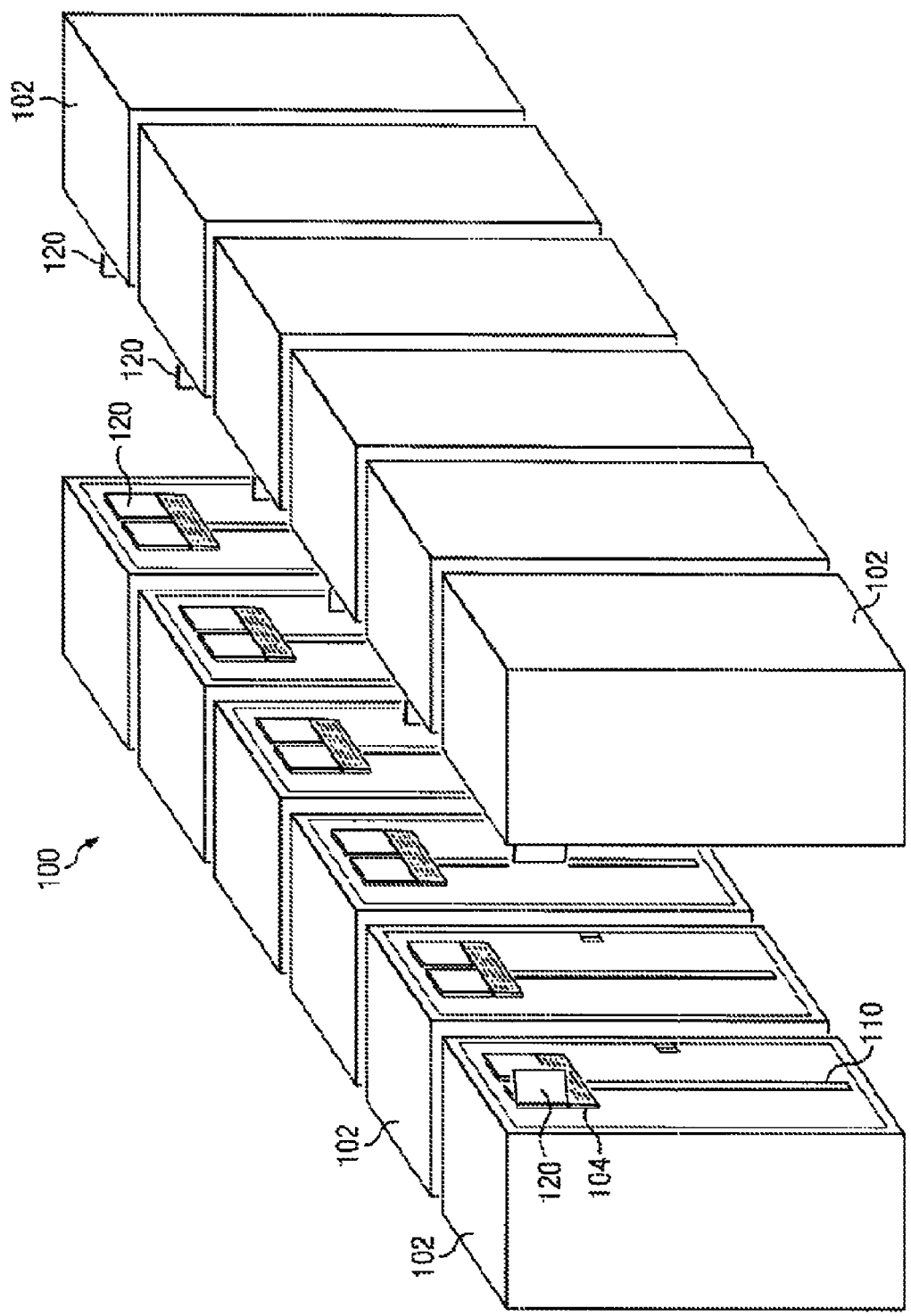
FIG. 1A is a diagram of a computer system 100 example embodiment of the invention.

FIG. 1A is a diagram of a computer system 100 in an example embodiment of the invention. Computer system 100 comprises two rows of racks 102. in other embodiments, there may be a different number of rows, and/or a different number of racks in each row. The rows of racks 102 are facing each other forming an isle between the two rows. Each rack may contain servers, power supplies, memory, storage devices, input/output (I/O) cards, or the like. Each rack 102 has a slot 110 on the front side of the rack 102. Slideably mounted into the slot 118 is a user interface (UI) device 120. The UI device 120 is coupled to the equipment inside the rack 120 and used to configure or monitor the status of the equipment mounted inside the rack 102. In one example embodiment of the invention. UI device 120 is coupled to one or more management controllers inside rack 102.

Figure 1B:
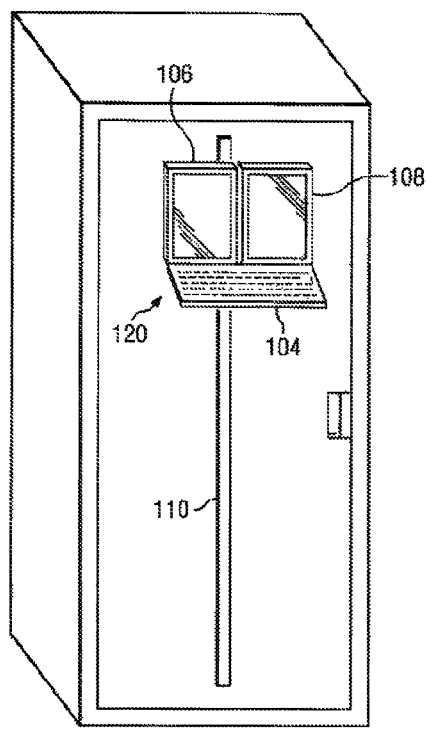
FIG. 1B is a front view of one of the racks 102 from FIG. 1A, in an exam embodiment of the invention.

FIG. 1B is a front view of one of the racks 102 from FIG. 1A, in an example embodiment of the invention. Attached to the front of the rack 102 is a UI device 120. UI device 120 comprises displays 106 and 108, and keyboard 104. Keyboard 104 may be configured to flip down when in use, and flip up for storage when not in use. In another example embodiment of the invention, displays 106 and/or 108 may be touch screens and ma replace or supplement keyboard 104. The height of UI device 120 can be adjusted by sliding UI device 120 up and down slot 110 formed in the from of rack 102. In one embodiment of the invention, slot 110 may be formed in a door mounted on the front of rack 102.

Figure 2A:
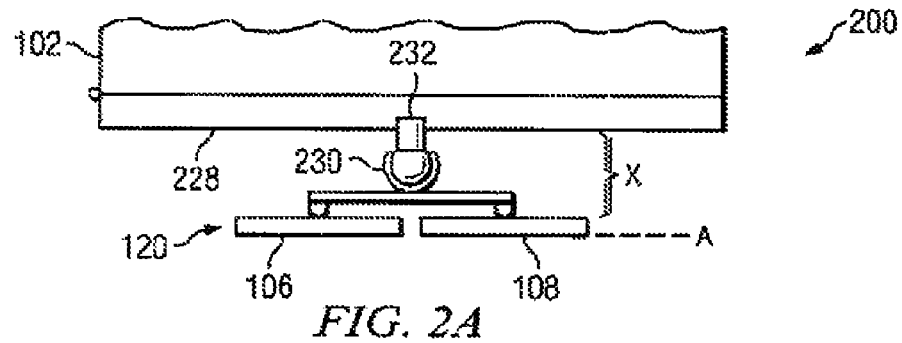
FIG. 2A is a top view of computer system 00 in an example embodiment of the invention.

FIG. 2A is a top view of a computer system 200 in an example embodiment of the invention. Computer system 200 comprises rack 102, door 228, and UI device 120. Door 228 is mounted onto the front side of rack 102 and can be rotated from a closed position (as shown) to an open position. UI device 120 is attached to the front face of door 228. UI device comprises display mounting device 230, and displays 106 and 108, Display mounting device 230 is mounted to door 228 in a slot 110 (shown in FIG. 1). Display mounting device 230 can be slid along the length of slot 110 to adjust the height of UI device 120. In other example embodiments of the invention, other mechanisms may be used instead of slot 110 to allow the height of UI device to be adjusted, for example, any type of linear slide, bail bearing slide, or the like may be used. When display mounting device 230 is attached to door 228 an electrical connection is made between UI device 120 and the rack 102.

Figure 2B:
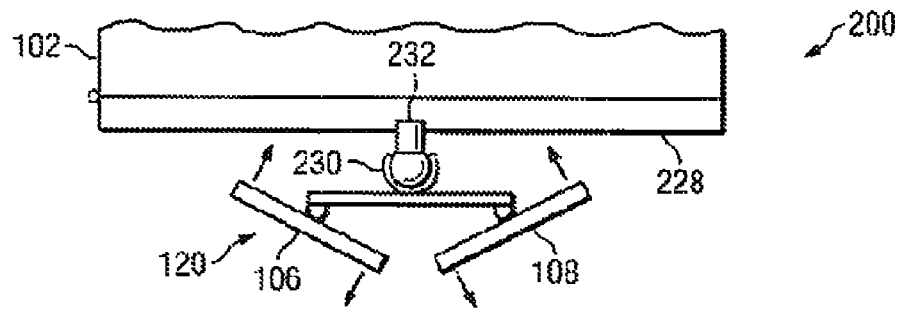
FIG. 2B is a top view of the computer system 200, with displays 106 and 108 being rotated into a second position, an example embodiment of the invention.

Displays 106 and 108 are rotatably attached to display mounting device 230. Displays 106 and 108 can be rotated into a first side-by-side position (shown in FIG. 2A) where the display surfaces of the two displays may form a common plane A. In some embodiments of the invention, the displays may rotate beyond the first position such that the display surfaces are slightly facing each other. In the first position, the displays can be seen from the front side of computer system 200. FIG. 2B is a top view of the computer system 200, with displays 106 and 108 being rotated into a second position, in an example embodiment of the invention.

In the second position, the display surfaces of the two displays face away from each other. In the second position, information on the displays can be seen from either side of computer system 200. When computer system 200 is in a row of computer systems (as shown in FIG. 1A), the information on the display screens can he seen from each end of the row. Because the height of the UI devices can be adjusted, the height of the different UI devices mounted on each rack in a row can be staggered. This would allow the information from each tack to be seen from either end of a row. in one example embodiment of the invention, the distance X (shown in FIG. 2A) is large enough such that the two displays (106 and 108) can be rotated to where the display surfaces are perpendicular to the front surface of door 228. Distance X also allows air to flow through openings in door 228, without being obstructed by the two displays, so that the equipment inside rack 102 can be cooled.

Figure 2C:
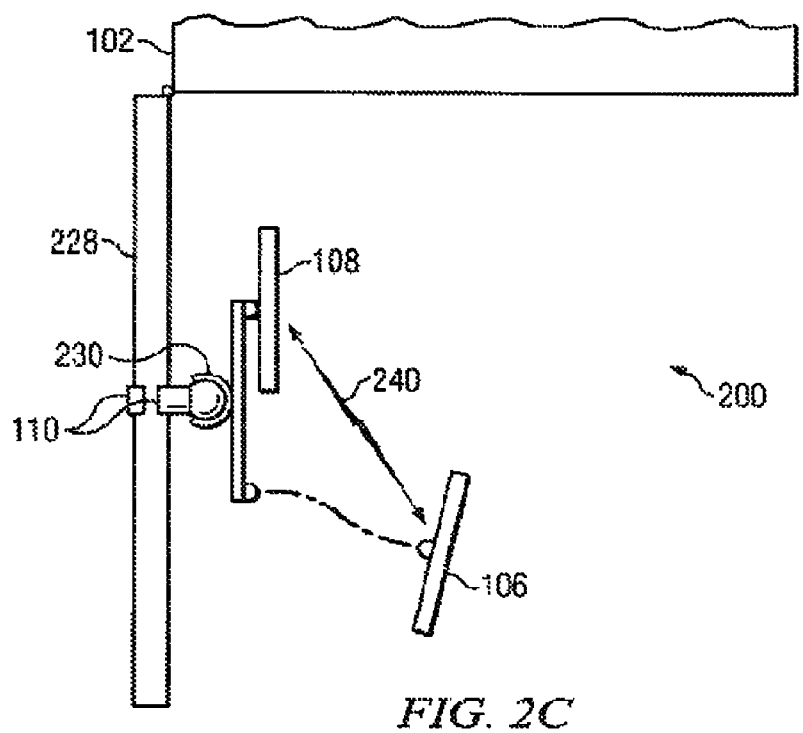
FIG. 2C shows a top view of computer system 200 with the door open, in an example embodiment of the invention.

FIG. 2C shows a top view of computer system 200 with the door open, in an example embodiment of the invention. In this example embodiment of the invention, a slot 110 is formed on both the front and back side of door 228. Display mounting device 230 is shown coupled to the slot 110 on the back side of door 228. Display mounting device 230 is removably coupled to slot 110, such that the UI device 120 can be moved from the back surface of door 228 to the front surface of door 228. There are a number of different ways that display mounting device can be removably coupled to slot 110, for example a connector mounted inside each of the slots 110 can be used to couple display mounting device to door 228. Once display mounting device is coupled to either the front or back slot, the height of the UI device 120 can be adjusted.

FIG. 2C also shows display 106 removed from display mounting device 230. In this example embodiment of the invention, there is a wireless link 240 between display 106 and display 108. Wireless link may be a Bluetooth link. Display 106 is removably mounted to display device 230, and can be detached and used within a short distance of display 108.

Display 106 may have all or part of its display screen configured as a touch screen so that it could be used as an input device, for example as a keyboard.

What is claimed is:

1. A user interface (UI) device, comprising:
   a display mounting device;
   two displays, wherein each display is ratatably mounted onto the display mounting device and movable between a first position and a second position, the displays being in a side-by-side relationship and a display surface on each of the two displays forms a common plane (A) when the displays are in the first position, and wherein the display surfaces of the two displays face away from each other in the second position;
   the display mounting device configured to be slideably attached to a front of a computer rack wherein the height of the UI device can be slideably adjusted when the display mounting device is attached to the front of the computer rack.

2. The UI device of claim 1, further comprising:
   a keyboard attached to the display mounting device and movable between a flip up storage position and a flip down use position.

3. The UI device of claim 1, wherein at least e of the displays is a touch screen display.

4. The UI device of claim 1, wherein the display surfaces of the two displays are parallel to each other in the second position.

5. The UI device of claim 1, further comprising:
   a computer rack having a door, wherein the door has a front face and a back face, wherein the display mounting device is configured to removeably slideably couple to either the front face or the back face of the door.

6. The UI device of claim 1, further comprising:
   a wireless link between the two displays, wherein one of the two displays is detachable from the display mounting device.

7. A method for displaying information, comprising:
   positioning two displays, that are attached to a front of a computer rack, in a side-by-side relationship wherein a display surface for each of the two displays forms a common plane such that information from both displays can be seen from in front of the computer rack;
   re-positioning the two displays such that the display surfaces of the two displays face away from each other such that information on one display can be seen from one side of the computer rack and information on the other display can be seen from the other side of the computer rack.

8. The method for displaying information of claim 7, further comprising:
   adjusting the height of the two displays by moving the two displays along a front face of the computer rack.

9. The method for displaying information of claim 7, wherein at least one of the displays is a touch screen display.

10. The method for displaying information of claim 7, further comprising:
    detaching one of the displays from the computer rack and using a wireless link between the two displays as the communication link between the detached display and the computer rack.

11. The method for displaying information of claim 7, wherein the two displays are removably attached to a front side of a door coupled to a front of the computer rack, and where the door can be moved between an open position and a closed position, and wherein when the door is in the open position, the two displays can be detached from the front side of the door and removably attached to a back side of the door.

* * * * *

UNITED STATES PATENT AND TRADEMARK OFFICE
CERTIFICATE OF CORRECTION

PATENT NO.        : 8,922,981 B2                                    Page 1 of 1
APPLICATION NO.   : 13/810582
DATED             : December 30, 2014
INVENTOR(S)       : Kevin B. Leigh et al.

It is certified that error appears in the above-identified patent and that said Letters Patent is hereby corrected as shown below:

In the Claims

In column 3, line 8 approx., in Claim 1, delete "ratatably" and insert -- rotatably --, therefor.

In column 3, line 26, in Claim 3, delete "e" and insert -- one --, therefor.

In column 3, line 34, in Claim 5, delete "removeably" and insert -- removably --, therefor.

Signed and Sealed this
First Day of December, 2015

Michelle K. Lee
*Director of the United States Patent and Trademark Office*